(12) United States Patent
Weiss et al.

(10) Patent No.: US 7,063,542 B2
(45) Date of Patent: Jun. 20, 2006

(54) COMPLIANT ELECTRICAL PROBE DEVICE INCORPORATING ANISOTROPICALLY CONDUCTIVE ELASTOMER AND FLEXIBLE CIRCUITS

(75) Inventors: Roger E. Weiss, Foxboro, MA (US); Christopher Cornell, South Dartmouth, MA (US)

(73) Assignee: Paricon Technologies Corporation, Fall River, MA (US)

( * ) Notice: Subject to any disclaimer, the term of this patent is extended or adjusted under 35 U.S.C. 154(b) by 0 days.

(21) Appl. No.: 10/876,352

(22) Filed: Jun. 24, 2004

(65) Prior Publication Data

US 2005/0009386 A1 Jan. 13, 2005

Related U.S. Application Data

(63) Continuation-in-part of application No. 10/286,994, filed on Jun. 13, 2002.

(51) Int. Cl.
*H01R 12/00* (2006.01)
*H05K 1/00* (2006.01)

(52) U.S. Cl. ....................................... 439/67
(58) Field of Classification Search .................. 439/67, 439/66

See application file for complete search history.

(56) References Cited

U.S. PATENT DOCUMENTS

| 4,737,112 A * | 4/1988 | Jin et al. ...................... 439/66 |
| 6,027,346 A | 2/2000 | Sinsheimer et al. .......... 439/66 |
| 6,888,362 B1 * | 5/2005 | Eldridge et al. ............ 324/757 |

* cited by examiner

*Primary Examiner*—Javaid H. Nasri
(74) *Attorney, Agent, or Firm*—Brian M. Dingman; Mirick, O'Connell, DeMallie & Lougee

(57) ABSTRACT

A compliant electrical probe device. The device has an anisotropic conductive elastomer (ACE) material-based layer defining two opposing faces, and having a series of conductive pathways extending between the faces. The device further includes at least two flexible circuit elements, each flexible circuit element defining two opposing faces, one face of one of the flexible circuit elements in electrical and physical contact with one face of the ACE-based layer, and one face of the other flexible circuit element in electrical and physical contact with the other face of the ACE-based layer, the other face of each of the flexible circuit elements carrying one or more electrically-conductive pads that define the device contacts, the flexible circuit elements each further comprising a series of conductive pathways extending between its faces. The ACE-based layer and the flexible circuit elements make up the device.

20 Claims, 4 Drawing Sheets

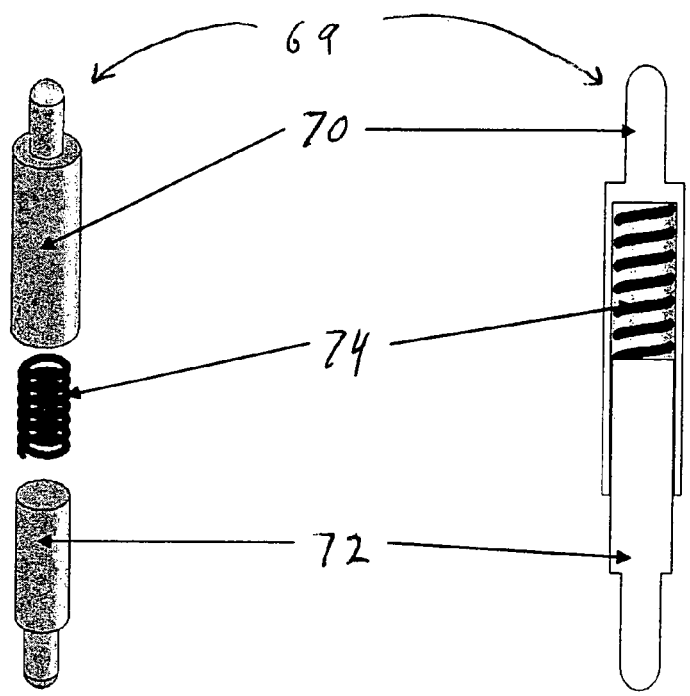
FIG. 4A
(Prior Art)
FIG. 4B
(Prior Art)
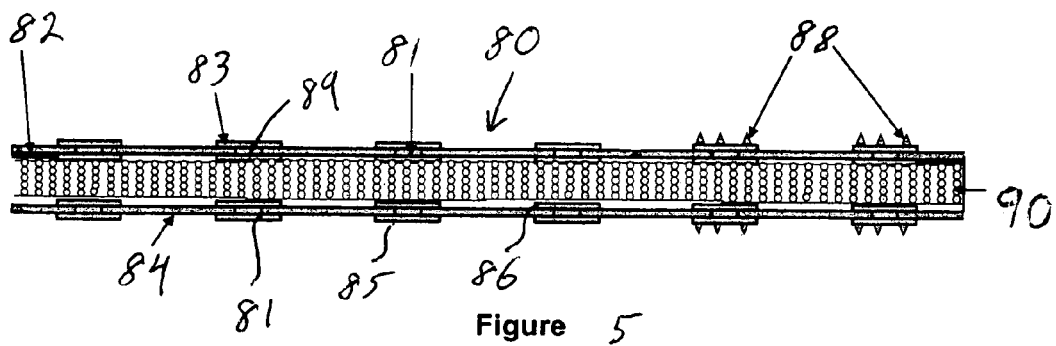
Figure 5

US 7,063,542 B2

COMPLIANT ELECTRICAL PROBE DEVICE INCORPORATING ANISOTROPICALLY CONDUCTIVE ELASTOMER AND FLEXIBLE CIRCUITS

CROSS REFERENCE TO RELATED APPLICATION

This application is a continuation in part of pending application Ser. No. 10/286,994, filed on Jun. 13, 2002.

FIELD OF THE INVENTION

This invention relates to compliant electrical interconnect devices.

BACKGROUND OF THE INVENTION

Anisotropic Conductive Elastomer (ACE) is a composite of conductive metal elements in an elastomeric matrix that is normally constructed such that it conducts along one axis only. In general, ACE is made to conduct through its thickness. One form of ACE material is made by mixing magnetic particles with a liquid resin, forming the mix into a continuous sheet, and curing the sheet in the presence of a magnetic field. This results in the particles forming a large number of closely spaced columns through the sheet thickness. The columns are electrically conductive. The resulting structure has the unique property of being both flexible and anisotropically conductive. These properties provide for an enabling interconnection medium which, when combined with other technologies, make it possible to realize new interconnect capabilities.

BGA (ball grid array) devices are electronic components with solder balls placed in a grid and used for final installation (through a solder reflow process) on a printed circuit board. There are other types of electronic packages in which the invention is relevant, including Land Grid Arrays (LGA) that have flat-topped pads (lands) with minimal height. Also, Column Grid Arrays (CGA) have protruding columns rather than balls or pads. The needs of the specific application determine which geometry is used.

It is important for the surface of the ball, pad or column that touches the circuit pad to be as free of defects as possible. Deformation of the solder ball of a BGA, especially in the apex area, can result in a defective solder joint. The BGA device is typically tested using a custom socket assembly that utilizes spring-loaded contacts. These contacts may have a serrated face that allows tangential contact with individual solder balls.

Although a serrated contact face provides an excellent electrical contact, the overall length of the pin creates a higher electrical inductance for the contact pin assembly as compared to the short path length provided by the ACE material. As microprocessor speeds increase, inductance hampers performance. Some manufacturers have seen this degradation at bandwidths as low as 500 MHz.

Spring loaded probe pins have long been used by the electronic industry to separably contact electrical systems. FIGS. 4A and 4B show a generic probe pin 69. Such a probe pin generally consists of three elements: a barrel 70, a spring 74, and a plunger 72, that together provide compliant electrical contact between two members (not shown in the drawing). There are many variations on the basic design, and such pins are made by many companies and sold under numerous trade names, such as the PogoPin® made by Everett Charles. As the electronic industry has evolved to higher speed and finer pitch, the required size of the probe pins has become a major manufacturing challenge. Furthermore, the performance and cost of these small probe pins does not meet the electronic industry expectations.

SUMMARY OF THE INVENTION

It is therefore an object of this invention to accomplish a compliant electrical probe device which greatly exceeds the performance of conventional spring probes.

It is a further object of this invention to provide such a device that can be used to accomplish low-loss, high-speed electrical interconnection, at frequencies of 30 GHz and greater.

This invention features a compliant electrical probe device comprising an anisotropic conductive elastomer (ACE) material-based layer defining two opposing faces and having a series of conductive pathways extending between the faces. The inventive probe device also includes and at least two flexible circuit elements, each flexible circuit element defining two opposing faces, one face of one of the flexible circuit elements in electrical and physical contact with one face of the ACE-based layer, and one face of another flexible circuit element in electrical and physical contact with the other face of the ACE-based layer, the other face of each of the flexible circuit elements carrying one or more electrically-conductive pads that define the device contacts, the flexible circuit elements each further comprising one or more conductive pathways extending between its faces. The ACE-based layer and flexible circuit elements together accomplish a compliant electrical probe device.

The ACE material may comprise conductive particles embedded in an elastomer, the conductive particles defining the conductive pathways. The flexible circuit element conductive pathways may comprise conductor-lined openings extending between the opposing faces of the flexible circuit element. In this case, at least one of the flexible circuit elements may comprise one or more electrically-conductive pads on both faces of the flexible circuit element, each pad being in electrical contact with one or more conductive pathways, to provide electrical contact areas on both faces of the flexible circuit element, the contact areas on one face of the flexible circuit elements interfacing with the ACE-based layer, and the contact areas on the other face of the flexible circuit elements for interfacing with an electrical device.

A plurality of conductive pads on at least one face of the flexible circuit element may be annular, each in electrical contact with a conductive pathway. The electrical device may comprise an electrical package with a series of electrical contact members protruding from a face thereof. The protruding electrical contact members may define an external peripheral shape, and the inside of the annular conductive pads may define essentially the same shape, so that a protruding electrical contact member contacts a conductive pad about essentially the entire periphery of the protruding electrical contact member. The electrical package may comprise a ball grid array with a series of external, partially-spherical contact members, and the inside of the annular conductive pads may define a circle having a diameter smaller than that of the spherical contact member, so that the contact member seats in the pad. The contact member may contact the pad such that the angle defined by coplanar radii from the contact member center to the contact member pad contact locations is approximately 60° to 90°.

The electrical package may comprise a series of external flat-topped pads or lands, or a series of external projecting columns having distal ends. The conductive pads may have a particular designed shape, to provide effective electrical contact with the contacts of the electrical package.

The conductive pads on the face of the flexible circuit element in contact with the ACE-based layer may be continuous, in order to maximize contact with the conductive columns in the ACE material. The compliant electrical probe device may further comprise asperities protruding from at least some of the electrically-conductive pads of at least one flexible circuit element. At least some of the conductive pathways of at least one flexible circuit element may comprise plated-through holes. At least some of the plated-through holes may be filled with a conductive material, for example a conductive paste.

The compliant electrical probe device may further comprise protruding contacts bonded to at least some of the electrically-conductive pads of at least one of the flexible circuit elements, to extend the conductive pads. The protruding contacts may present a generally spherical protruding contact surface. The protruding contacts may comprise metal spheres bonded to the conductive pads. The metal spheres may be soldered to the conductive pads.

Also featured is a compliant electrical probe device, comprising an anisotropic conductive elastomer (ACE) material-based layer defining two opposing faces and comprising a series of conductive pathways extending between the faces, wherein the ACE material comprises conductive particles embedded in an elastomer, the conductive particles defining the conductive pathways, and at least two flexible circuit elements, each flexible circuit element defining two opposing faces, one face of one of the flexible circuit elements in electrical and physical contact with one face of the ACE-based layer, and one face of another flexible circuit element in electrical and physical contact with the other face of the ACE-based layer, both faces of each of the flexible circuit elements carrying one or more electrically-conductive pads that define the electrical contacts of the flexible circuit elements, the flexible circuit elements each further comprising one or more conductor-lined openings extending between its faces. The ACE-based layer and flexible circuit elements together accomplish a compliant electrical probe device.

Also featured is a compliant electrical probe device, comprising an anisotropic conductive elastomer (ACE) material-based layer defining two opposing faces and comprising a series of conductive pathways extending between the faces, wherein the ACE material comprises conductive particles embedded in an elastomer, the conductive particles defining the conductive pathways, and at least two flexible circuit elements, each flexible circuit element defining two opposing faces, one face of each of the flexible circuit elements carrying electrically-conductive pads that are in electrical contact with the faces of the ACE-based layer, and the other face of each of the flexible circuit elements carrying electrically-conductive annular pads that define the electrical contacts of the device, the flexible circuit elements each further comprising one or more conductor-lined openings extending between its faces and electrically interconnecting the pads of the element. The ACE-based layer and flexible circuit elements together accomplish a compliant electrical probe device.

BRIEF DESCRIPTION OF THE DRAWINGS

Other objects, features and advantages will occur to those skilled in the art from the following description of the preferred embodiments, and the accompanying drawings, in which:

FIGS. 4A and 4B are exploded and cross-sectional views, respectfully, of a prior art probe pin;

FIG. 5 is a schematic sectional view of the preferred embodiment of the invention utilizing two flexible circuit elements to accomplish a compliant electrical probe device incorporating ACE, according to this invention.

DESCRIPTION OF THE PREFERRED EMBODIMENTS OF THE INVENTION

The present invention combines ACE material sandwiched between flexible elements, resulting in a pin-array style electrical connector circuit device with vertical compliance and low inductance. The flexible elements are preferably flexible circuits consisting of an electrically-insulating material such as polyimide, with opposing conductive pads on the surfaces. The pads are vertically interconnected by plated-through holes. The inventive device also will not substantially damage the apex area of the protruding conductive contacts of a protruding contact element of a BGA package.

Figure 1:
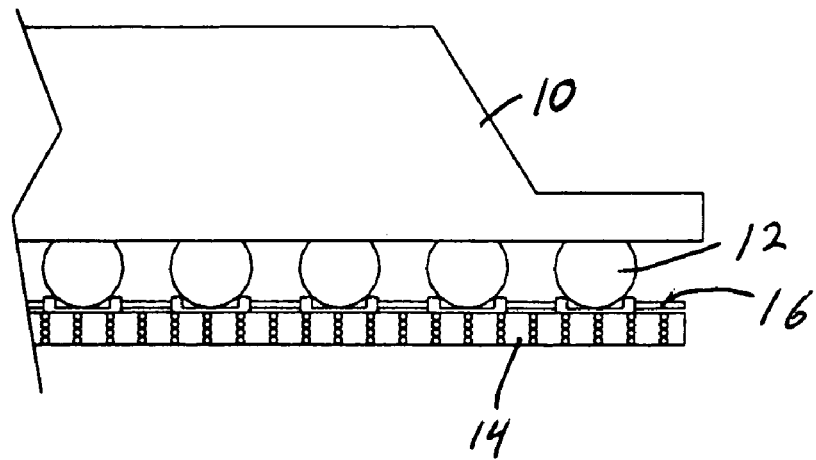
FIG. 1 is a schematic sectional view through the centerline of one of the rows of solder balls of a BGA mounted to the preferred embodiment of the interconnect device of the invention.
Figure 3A:
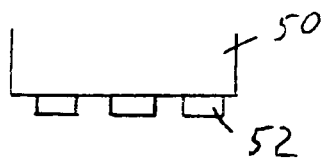
FIG. 3A is a schematic cross-sectional view of a land grid array, useful in understanding the invention.
Figure 3B:
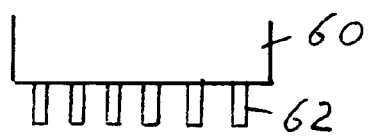
FIG. 3B is a similar view of a column grid array, also useful in understanding the invention.

FIG. 1 is a sectional view through the centerline of one of the rows of solder balls 12 of a BGA 10 mounted to the preferred embodiment of the invention comprising ACE material 14 electrically coupled to flexible circuit 16. FIG. 1 demonstrates only one embodiment of the invention. The invention comprises a combination of a unique flex circuit with ACE material to create an interconnect device with low inductance that protects the apex of the ball of the BGA, or the end or top of the land 52 of LGA 50, FIG. 3A, or end or top of pin 62 of CGA 60, FIG. 3B.

Figure 2:
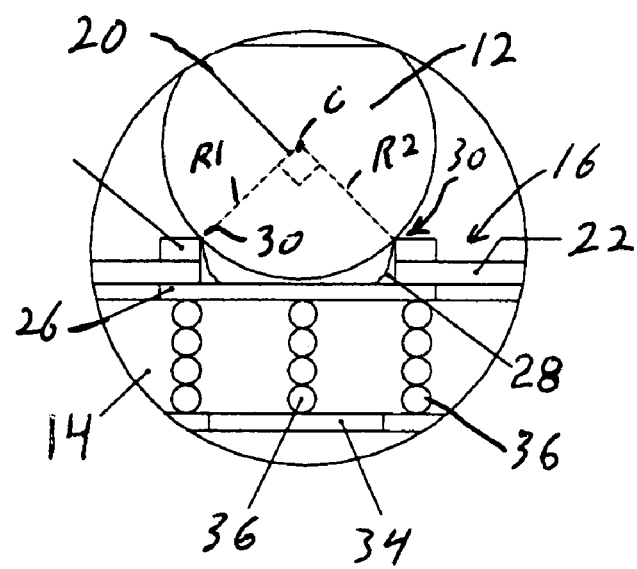
FIG. 2A is a schematic expanded sectional view of a single solder ball interconnected to a board using the interconnect device of FIG. 1.
FIG. 2B is a schematic view of one of the annular pads of the device of FIG. 1.
FIG. 2C is a schematic view of one of the solid pads of the device of FIG. 1.
FIG. 2D is a schematic view of an alternative to the annular pad shape of FIG. 2B.
Figure 2B:
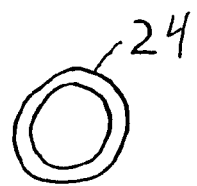
Figure 2C:
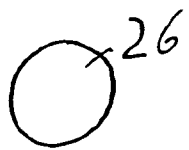

FIG. 2A is a schematic expanded view of a single solder ball interconnected to a board (not shown) using the device of FIG. 1. Flex circuit 16 houses plated through holes 28 that have a different top and bottom configuration. The annular conductive pad 24 on the top side (the side facing solder ball 12) has a finished hole size that is smaller in diameter than ball 12, so that ball 12 "seats" on pad 24 (FIG. 2B). The finished hole 28 is preferably sized such that the triangle formed between the ball center "C" and the two coplanar radii R1 and R2 that intersect the tangent points 30 to plated-through hole 28, form an angle 20 of from about 60 degrees to about 90 degrees. The bottom side of the hole is a continuous, solid pad area 26 (FIG. 2C) providing maximum contact with ACE material 14.

Surfaces of conductors can oxidize. The monomolecular oxide layer is an insulator, thus potentially reducing or inhibiting the electrical connection to the device. The sharp tangent points or edges 30 can penetrate oxide layers on the contacts 12, to increase or enhance the electrical connection between ball contacts 12 and the flex circuit. This action is known in the art as "wipe".

Flex circuit 16 protects ball 12 as well as providing wipe during interconnection. It also serves as a wear member allowing many reuse cycles. It also provides limited compensation for lack of device flatness and tolerance variation on the ball diameter. This compensation is, in general, insufficient for the broad range of BGA devices available. Most of the dynamic range is provided by the ACE material 14, which can add up to several mils of dynamic range to the interconnect. ACE material 14 includes conductive pathways or columns 36, in this instance created from a series of generally aligned conductive particles that are in electrical contact when the ACE material is compressed.

The flex circuits of the invention are preferably made from a base material consisting of a polymer flex circuit with copper laminated on one side. A laser or another means such as a drill is used to create holes through the polymer from the non-copper side. The laser is tuned to penetrate the flex material (typically electrically insulating polyimide material), but not the copper. Conventional plate, print and etch technology is used to form the pads on both sides, and to interconnect the top and bottom sides. The combination of laser drilled and plated holes results in the desired finished hole size and configuration.

Figure 2D:
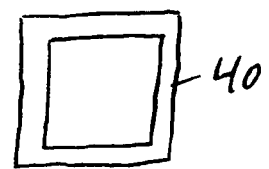

This is but one of the configurations of the invention. Alternate forms are as follows. Instead of electrically insulating polyimide material as the carrier in the flexible circuit, the invention could utilize a more compliant material such as silicone. This variation would allow the gold plated pads a degree of motion that would assist in the alignment of the solder ball. Also, the annular pad 24 that contacts the solder ball has been shown as circular, FIG. 2B. Other shapes are contemplated, such as diamond or square shaped 40, FIG. 2D, as non-limiting examples. Pad shape can be engineered to facilitate different interconnecting geometries, or to provide a smaller contact zone. The use of a laser allows the creation of holes of any shape. Further, what has been shown herein is the flex and ACE material as two distinct parts. However, the ACE material could be cast directly on the flexible circuit itself, creating an integral interconnect device.

The preferred compliant electrical probe device of the invention is shown in FIG. 5. Device 80 comprises flexible circuit elements 82 and 84 in contact with both faces of ACE material 90. Flexible circuit elements 82 and 84 each define a number of conductive pad pairs that are typically aligned vertically as shown in the drawing, to accomplish a vertically-compliant two-ended device having a number of contacts typically spaced at a fine pitch. The through-conductors 81 of flexible circuits 82 and 84 each comprise lower and upper conductive pads that are electrically interconnected, typically using a plated-through hole, such as a via that is lined with or filled with a conductor such as a copper. Lower pads 86 and 89 and upper pads 83 and 85 provide contact to the ACE and an external device, respectively. The flex circuit material is made of a stable, non-conductive material such as Kapton. It is typically thin, of the order of 0.002 inches, to allow each pad to move substantially independently of its neighbors in the z-axis (vertical) direction.

The result is a compliant electrical probe 80 that mimics the functionality of a conventional spring probe. The opposing, outwardly-directed electrical pads of the two flexible circuit elements mimic the pin contacts, and the intervening ACE material provides the vertical compliance, as it is a spring-like compressible material. The ACE is compressed as the device is compressed between opposing conductors. This arrangement accomplishes a probe that can have contacts at a very fine pitch while being useful for extremely high speed electrical interconnections.

In one embodiment, asperities 88 are added to the surface of outer pads 83 to assist in penetrating through insulating layers (such as an oxide layer) on the conductors. Asperities 88 act as a means for penetrating any oxide layer that is present, to increase or enhance the electrical connection between the compliant electrical probe device of the invention and the electrical device to which it is connected. Asperities 88 can be formed by several methods, such as dendritic plating, plated diamond or ceramic shards, or hard metal particles. Laser scribing of the pads could also be employed to accomplish a roughened surface with a plurality of sharp protrusions.

Figure 6:
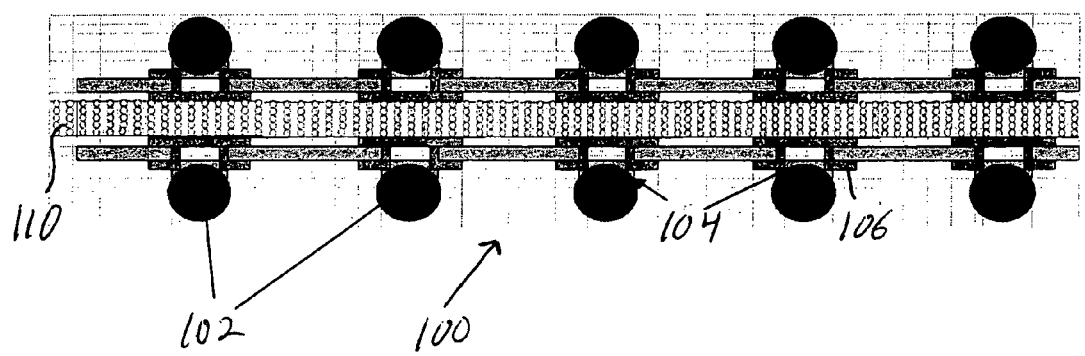
FIG. 6 is a similar diagram of an alternative embodiment in which the probe contacts are extended with protruding electrically-conductive elements.

Another embodiment of the inventive device 100, FIG. 6, is similar to device 80, FIG. 5, but with protruding contacts bonded to at least some of the electrically-conductive pads of one or both of the flexible circuit elements. These protruding contacts can extend the pad, and also create a desired external pad shape, such as spherical, to mimic the shape of probe pin contact surfaces. Spherical conductive balls 102 can be bonded to pads 106 of device 100. For example, balls 102 could be a hard metal such as soldered or gold-plated nickel, or a copper alloy plated with nickel, gold or solder, for example. Balls 102 can be soldered at areas 104 to pads 106. ACE layer 110 is sandwiched between the two flexible circuit elements, as described above. Obviously, other contact shapes could be accomplished in a similar manner, to accommodate a desired contact shape or size.

As another alternative, the ACE material can be bonded to one or both of the flexible circuits. The ACE can be mounted in tension.

Both the ACE layer and the two flexible circuits can be made very thin, with conductors based at a fine pitch as fine as 0.4 millimeters or less. Using this approach, fine pitch, high performance probes can be constructed having a thickness as little as 0.010 inches or less. This allows these probes to be used at frequencies greater than 30 GHz.

Other embodiments will occur to those skilled in the art and are within the following claims.

The invention claimed is:

1. A compliant electrical probe device for conducting electrical signals from an electronic package on one side of the compliant electrical probe device to an electrical member on the other side of the compliant electrical probe device, the compliant electrical probe device comprising:

an anisotropic conductive elastomer (ACE) material-based layer defining two opposing faces and comprising a series of conductive pathways extending between the faces; and at least two flexible circuit elements, each flexible circuit element defining two opposing faces with a flexible insulating layer between the faces, an inner face of one of the flexible circuit elements comprising spaced conductive pads in electrical and physical contact with one face of the ACE-based layer, and an inner face of another flexible circuit element comprising spaced conductive pads in electrical and physical contact with the other face of the ACE-based layer, the outer faces of each of the flexible circuit elements carrying electrically-conductive pads that define the contacts for the electronic package and the electrical member, the flexible circuit elements each further comprising conductive pathways interconnecting opposing pads on its faces;

wherein the ACE-based layer and flexible circuit elements together accomplish a compliant electrical probe device.

2. The compliant electrical probe device of claim 1, wherein the ACE material comprises conductive particles embedded in an elastomer, the conductive particles defining the conductive pathways.

3. The compliant electrical probe device of claim 1, wherein the flexible circuit element conductive pathways comprise conductor-lined openings extending between the conductive pads on opposing faces of the flexible circuit element.

4. The compliant electrical probe device of claim 1, wherein a plurality of conductive pads on the outer face of a flexible circuit element are annular, and are each in electrical contact with a conductive pathway.

5. The compliant electrical probe device of claim 4, wherein the electronic package has a series of electrical contact members protruding from a face thereof.

6. The compliant electrical probe device of claim 5, wherein the electronic package comprises a column grid array with a series of external projecting column contact members.

7. The compliant electrical probe device of claim 5, wherein the electronic package comprises a ball grid array with a series of external, partially-spherical contact members, and wherein the inside of the annular conductive pads define a circle having a diameter smaller than that of the spherical contact member, so that the contact member seats in the pad.

8. The compliant electrical probe device of claim 7, wherein the contact member contacts the pad such that the angle defined by coplanar radii from the contact member center to the contact member pad contact locations is approximately between 60° and 90°.

9. The compliant electrical probe device of claim 1, wherein at least some of the conductive pads on the inner faces of the flexible circuit elements are continuous, in order to promote electrical contact between the flexible circuit elements and the conductive columns in the ACE material.

10. The compliant electrical probe device of claim 5, wherein the electronic package comprises a land grid array with a series of external flat-topped pads.

11. The compliant electrical probe device of claim 1, further comprising asperities protruding from at least some of the electrically-conductive pads on the outer face of at least one flexible circuit element.

12. The compliant electrical probe device of claim 1, wherein at least some of the conductive pathways of at least one flexible circuit element comprise plated-through holes.

13. The compliant electrical probe device of claim 12, wherein at least some of the plated-through holes are conductor-filled.

14. The compliant electrical probe device of claim 1, further comprising protruding contacts bonded to at least some of the electrically-conductive pads on the outer face of at least one of the flexible circuit elements, to extend the conductor out from the outer face.

15. The compliant electrical probe device of claim 14, wherein the protruding contacts present a generally spherical protruding contact surface.

16. The compliant electrical probe device of claim 15, wherein the protruding contacts comprise conducting spheres bonded to the conductive pads.

17. The compliant electrical probe device of claim 16, wherein the conducting spheres are soldered to the conductive pads.

18. A compliant electrical probe device for conducting electrical signals from an electronic package on one side of the compliant electrical probe device to an electrical member on the other side of the compliant electrical probe device, the compliant electrical probe device comprising:

an anisotropic conductive elastomer (ACE) material-based layer defining two opposing faces and comprising a series of conductive pathways extending between the faces, wherein the ACE material comprises conductive particles embedded in an elastomer, the conductive particles defining the conductive pathways; and at least two flexible circuit elements, each flexible circuit element defining two opposing faces with a flexible insulating layer between the faces, one face of one of the flexible circuit elements in electrical and physical contact with one face of the ACE-based layer, and one face of another flexible circuit element in electrical and physical contact with the other face of the ACE-based layer, both faces of each of the flexible circuit elements carrying one or more electrically-conductive elements that define the electrical contacts of the flexible circuit elements, the flexible circuit elements each further comprising conductor-lined openings extending between its faces and interconnecting opposing electrically-conductive elements, one or more of the conductive elements comprising protruding conductive contacts presenting generally spherical protruding contact surfaces;

wherein the ACE-based layer and flexible circuit elements together accomplish a compliant electrical probe device.

19. A compliant electrical probe device for conducting electrical signals from an electronic package on one side of the compliant electrical probe device to an electrical member on the other side of the compliant electrical probe device, the compliant electrical probe device comprising:

an anisotropic conductive elastomer (ACE) material-based layer defining two opposing faces and comprising a series of conductive pathways extending between the faces, wherein the ACE material comprises conductive particles embedded in an elastomer, the conductive particles defining the conductive pathways; and at least two flexible circuit elements, each flexible circuit element defining two opposing faces with a flexible insulating layer between the faces, an inner face of one of the flexible circuit elements in electrical and physical contact with one face of the ACE-based layer, and an inner face of another flexible circuit element in electrical and physical contact with the other face of the ACE-based layer, both faces of each of the flexible circuit elements carrying a plurality of electrically-conductive pads that define the electrical contacts of the flexible circuit elements, the flexible circuit elements each further comprising one or more conductor-lined openings extending between its faces and interconnecting opposing pads;

wherein the ACE-based layer and flexible circuit elements together accomplish a compliant electrical probe device.

20. A compliant electrical probe device for conducting electrical signals from an electronic package on one side of the compliant electrical probe device to an electrical member on the other side of the compliant electrical probe device, the compliant electrical probe device comprising:

an anisotropic conductive elastomer (ACE) material-based layer defining two opposing faces and comprising a series of conductive pathways extending between the faces, wherein the ACE material comprises conductive particles embedded in an elastomer, the conductive particles defining the conductive pathways; and at least two flexible circuit elements, each flexible circuit element defining two opposing faces with a flexible insulating layer between the faces, one face of each of the flexible circuit elements carrying electrically-conductive pads that are in electrical contact with the faces of the ACE-based layer, and the other face of each of the flexible circuit elements carrying electrically-conductive annular pads that define the electrical contacts of the device, the flexible circuit elements each further comprising one or more conductor-lined openings extending between its faces and electrically interconnecting the pads of the flexible circuit element;

wherein the ACE-based layer and flexible circuit elements together accomplish a compliant electrical probe device.

* * * * *